(12) United States Patent
Veychard et al.

(10) Patent No.: US 9,337,160 B2
(45) Date of Patent: May 10, 2016

(54) COPPER WIRE RECEIVING PAD

(75) Inventors: Damien Veychard, Meylan (FR);
Fabien Quercia, Saint Marcelin (FR);
Eric Perriaud, Pont de Claix (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 412 days.

(21) Appl. No.: 13/538,740

(22) Filed: Jun. 29, 2012

(65) Prior Publication Data

US 2013/0001777 A1   Jan. 3, 2013

(30) Foreign Application Priority Data

Jun. 30, 2011 (FR) .................................. 11 55881

(51) Int. Cl.
*H01L 21/44* (2006.01)
*H01L 23/48* (2006.01)
(Continued)

(52) U.S. Cl.
CPC ............... *H01L 24/03* (2013.01); *H01L 24/05* (2013.01); *H01L 24/48* (2013.01); *H01L 24/45* (2013.01); *H01L 2224/02166* (2013.01); *H01L 2224/04042* (2013.01); *H01L 2224/05147* (2013.01);
(Continued)

(58) Field of Classification Search
CPC ........... H01L 2224/45147; H01L 2224/48824; H01L 2224/85205; H01L 2224/05147; H01L 2224/05556; H01L 2224/05624; H01L 2224/48463; H01L 2224/48507; H01L 2224/85048; H01L 24/03; H01L 24/05; H01L 24/45; H01L 24/48; H01L 2924/00; H01L 2924/01006; H01L 2924/01013; H01L 2924/01033; H01L 2924/0105; H01L 2924/01073; H01L 2924/14; H01L 2924/20105; H01L 23/53228; H01L 23/53233; H01L 23/53238; H01L 23/53223; H01L 2224/05647; H01L 2224/13147; H01L 2224/13647; H01L 2224/29647; H01L 2224/37147; H01L 2224/37647; H01L 2224/45647; H01L 2224/48647; H01L 2224/48799; H01L 2224/48847; H01L 2224/80447; H01L 2224/80895; H01L 2224/81447; H01L 2224/4845; H01L 2224/48451; H01L 2224/48456; H01L 2224/48458; H01L 2224/04042; H01L 2224/11526; H01L 2224/13028; H01L 2224/48455; H01L 2924/15747; H01L 2924/16747; H01L 2924/17747; H01L 21/4885; H01L 21/76895; H01L 21/02304; H01L 21/02362; H01L 21/76829; H01L 21/76841; H01L 21/7685; H01L 2224/16157; H01L 2224/48453; H01L 2924/01029; H01L 2224/29147; H01L 2924/00014; H01L 2924/00015; H01L 2224/45015; H01L 2224/02166
USPC .................... 257/737, 738, 780, 751; 438/612
See application file for complete search history.

(56) References Cited

U.S. PATENT DOCUMENTS 5,003,373 A * 3/1991 Tsumura .............. B23K 20/007
228/110.1
6,011,305 A * 1/2000 Suzuki .................. B23K 20/007
257/738

(Continued)

FOREIGN PATENT DOCUMENTS

JP          11284176 A    * 10/1999
JP          2007027335 A     2/2007
WO          03/075340 A2     9/2003

*Primary Examiner* — Teresa M. Arroyo
(74) *Attorney, Agent, or Firm* — Seed IP Law Group PLLC

(57) ABSTRACT

One embodiment is directed to a welding pad capable of receiving a ball-shaped copper wire at its end, including a first copper pad coated with a protection layer and topped with a second pad containing aluminum having dimensions smaller than those of the first pad and smaller than the ball diameter once said ball has been welded to the welding pad.

18 Claims, 4 Drawing Sheets

(51) Int. Cl.
  *H01L 23/52*  (2006.01)
  *H01L 29/40*  (2006.01)
  *H01L 23/00*  (2006.01)

(52) U.S. Cl.
  CPC ........... *H01L2224/05556* (2013.01); *H01L 2224/05624* (2013.01); *H01L 2224/45015* (2013.01); *H01L 2224/45147* (2013.01); *H01L 2224/48453* (2013.01); *H01L 2224/48463* (2013.01); *H01L 2224/48507* (2013.01); *H01L 2224/48824* (2013.01); *H01L 2224/85048* (2013.01); *H01L 2224/85205* (2013.01); *H01L 2924/0105* (2013.01); *H01L 2924/01006* (2013.01); *H01L 2924/01013* (2013.01); *H01L 2924/01029* (2013.01); *H01L 2924/01033* (2013.01); *H01L 2924/01073* (2013.01); *H01L 2924/14* (2013.01); *H01L 2924/20105* (2013.01)

(56) References Cited

U.S. PATENT DOCUMENTS

| | | | |
|---|---|---|---|
| 6,544,880 B1 | 4/2003 | Akram | |
| 6,616,967 B1* | 9/2003 | Test | C23C 18/1651 257/E21.174 |
| 2001/0033020 A1* | 10/2001 | Stierman | H01L 23/53228 257/737 |
| 2001/0035452 A1* | 11/2001 | Test | H01L 21/288 228/180.5 |
| 2002/0121709 A1* | 9/2002 | Matsuki et al. | 257/786 |
| 2003/0230809 A1* | 12/2003 | Nakajima et al. | 257/758 |
| 2004/0135223 A1 | 7/2004 | Allman et al. | |
| 2004/0197979 A1* | 10/2004 | Jeong et al. | 438/202 |
| 2005/0206007 A1* | 9/2005 | Li | H01L 21/7684 257/762 |
| 2005/0224984 A1* | 10/2005 | Hortaleza | H01L 24/03 257/762 |
| 2005/0258540 A1* | 11/2005 | Minda | 257/738 |
| 2006/0017160 A1* | 1/2006 | Huang | 257/737 |
| 2007/0096320 A1 | 5/2007 | Takemura et al. | |
| 2008/0111244 A1* | 5/2008 | Tessmer | H01L 24/05 257/765 |
| 2008/0179745 A1* | 7/2008 | Hess | H01L 24/05 257/751 |
| 2009/0079094 A1* | 3/2009 | Lin | 257/778 |
| 2009/0160049 A1* | 6/2009 | Shinkai et al. | 257/737 |
| 2010/0164096 A1* | 7/2010 | Daubenspeck et al. | 257/737 |
| 2011/0101523 A1* | 5/2011 | Hwang et al. | 257/737 |
| 2011/0266667 A1* | 11/2011 | Wu et al. | 257/737 |
| 2012/0119359 A1* | 5/2012 | Im et al. | 257/737 |
| 2012/0273937 A1* | 11/2012 | Choi | 257/737 |
| 2014/0124927 A1* | 5/2014 | Lin et al. | 257/738 |
| 2014/0124928 A1* | 5/2014 | Lin et al. | 257/738 |
| 2014/0124929 A1* | 5/2014 | Lin et al. | 257/738 |
| 2014/0145339 A1* | 5/2014 | Chopin et al. | 257/762 |
| 2014/0264843 A1* | 9/2014 | Lin et al. | 257/737 |
| 2014/0319680 A1* | 10/2014 | Choi et al. | 257/737 |

* cited by examiner

COPPER WIRE RECEIVING PAD

BACKGROUND

1. Technical Field

The present disclosure relates to the electric connection between an integrated circuit pad and a copper wire.

2. Description of the Related Art

A connection mode between an integrated circuit pad and a connection wire is shown in FIGS. 1A and 1B.

FIG. 1A shows a portion of an integrated circuit 1 comprising a connection pad 2 to which a copper wire 3, comprising, at its end intended to be attached to the pad, a ball 4, is desired to be welded or bonded. Pad 2 is formed of a stack of three layers, that is, a copper layer 5, a titanium nitride barrier layer 6, and an aluminum layer 7. A passivation dielectric layer 8 covers the periphery of the welding pad and defines a window 9 which delimits surface 10 of the welding pad.

The welding is performed between the end of the wire comprising the copper ball and aluminum layer 7 heated between 150° and 180° C. The copper ball is pressed against the pad and ultrasounds are applied thereto.

FIG. 1B shows the structure after welding. Ball 4 is crushed against surface 10 of pad 2. Ball 4 penetrates into the aluminum layer. The aluminum pushed back by the ball forms extrusions 21 and a space 20 forms between the copper ball periphery and surface 10. Contact areas 22 between the copper ball periphery and surface 10 are exposed to the ambient air which flows in space 20.

FIG. 2A illustrates the copper aluminum compounds present between layer 7 and ball 4. From aluminum layer 7, aluminum-rich compounds 23 such as $CuAl_2$, followed by components comprising less aluminum 24, such as CuAl, and finally, at the interface with copper ball 4, copper-rich compounds 25 such as $Cu_9Al_4$ or $Cu_3Al_2$, can be found.

By reaching areas 22, the humidity of the ambient air and of the chlorine present in the materials or brought from the outside may modify the chemical composition of copper aluminum compounds.

FIG. 2B illustrates the aluminum-oxygen compounds resulting from this transformation, such as $Al_2O_3$ or aluminum-chlorine, such as $AlCl_2$, forming layer 26 located between layer 23 and layer 4. The copper aggregates in islands in layer 26.

Stress resulting from the integrated circuit operation, like vibrations or temperature variations, weakens the interface layers located in area 22, and a separation between the pad and the copper wire can sometimes be observed during the circuit lifetime, despite the optimizations of welding techniques.

A reliability issue linked to the welding of the copper wire on aluminum is thus raised, this issue becoming more critical during the use of the product.

BRIEF SUMMARY

One or more embodiments of the present disclosure is directed to performing a robust, time-reliable welding while keeping known methods of copper wire welding on aluminum.

Thus, an embodiment provides a specific pad structure having a shape enabling to prevent the penetration of ambient air into an area comprising copper aluminum compounds.

More specifically, an embodiment provides a welding pad capable of receiving a ball-shaped copper wire at its end, comprising a first copper pad coated with a protection layer and topped with a second pad containing aluminum, having dimensions smaller than those of the first pad and smaller than the ball diameter once said ball has been welded to the welding pad.

According to an embodiment, the second pad is made of pure aluminum.

According to an embodiment, the second pad is an alloy containing copper, preferably 0.8% of copper.

An embodiment provides a pad further comprising a dielectric covering the periphery of the first pad.

According to an embodiment, the protection structure is made of titanium nitride.

According to an embodiment, the second pad is divided into a plurality of protrusions.

An embodiment provides a method for manufacturing a welding pad comprising the manufacturing steps of:

forming a first copper pad coated with a protection layer;

forming at least one second aluminum pad partially covering the first copper pad and having a size smaller than the diameter of the copper ball that it is intended to receive; and forming a window above the welding pad in a passivation layer exposing the second pad and covering the periphery of the first pad.

An embodiment of the present disclosure provides a method further comprising the steps of:

taking the surface of the pad to a temperature ranging between 50° and 100° C.;

bringing the copper ball closer to said pad; and pressing the copper ball and having it vibrate on the welding pad to entirely cover the second pad and a ring of the first pad adjacent to the second pad.

The foregoing and other objects, features, and advantages will be discussed in detail in the following non-limiting description of specific embodiments in connection with the accompanying drawings.

DETAILED DESCRIPTION

Figure 1A:
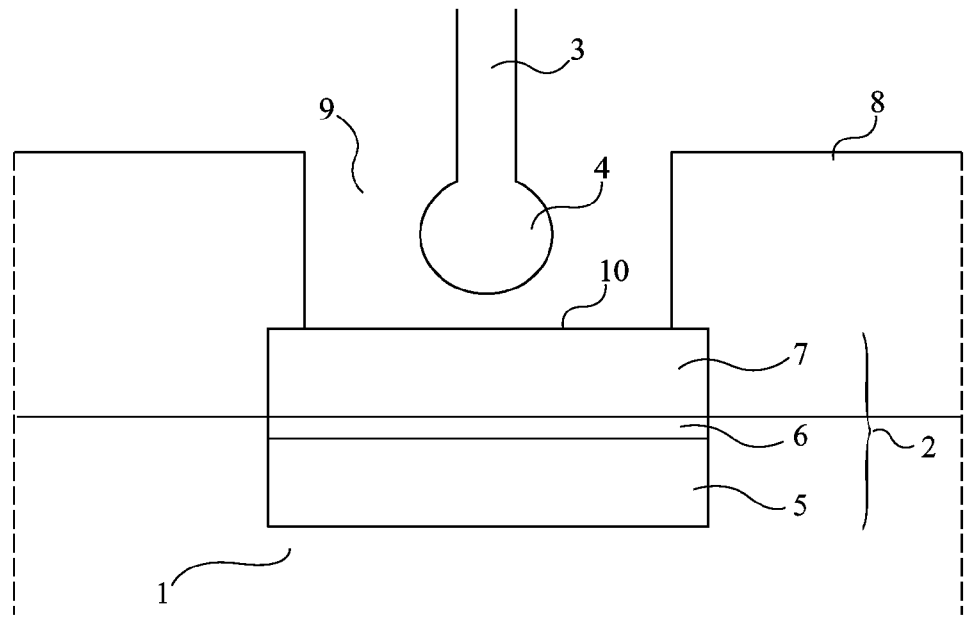
FIGS. 1A and 1B are cross-section views illustrating the welding between a copper wire and a pad containing aluminum according to the state of the art.
Figure 1B:
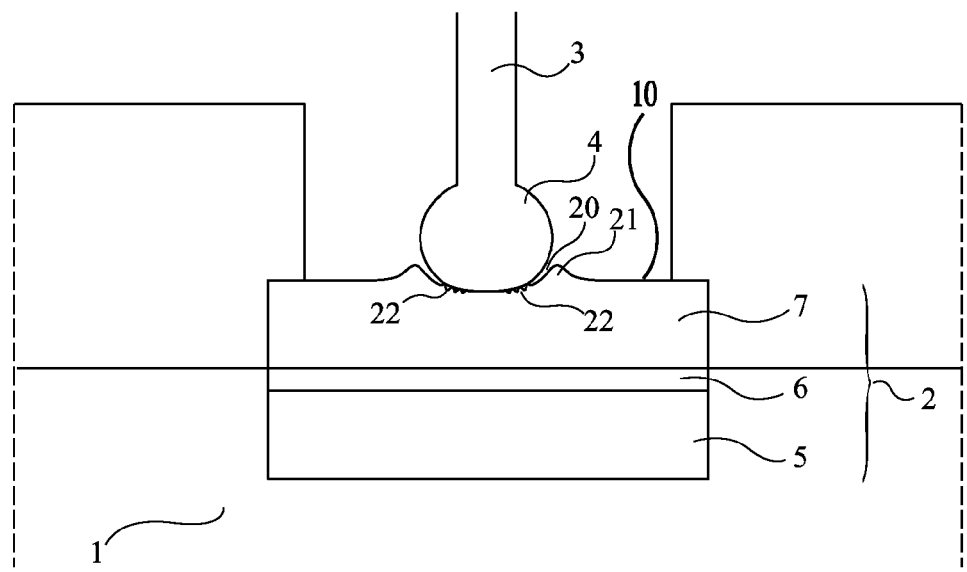
Figure 2A:
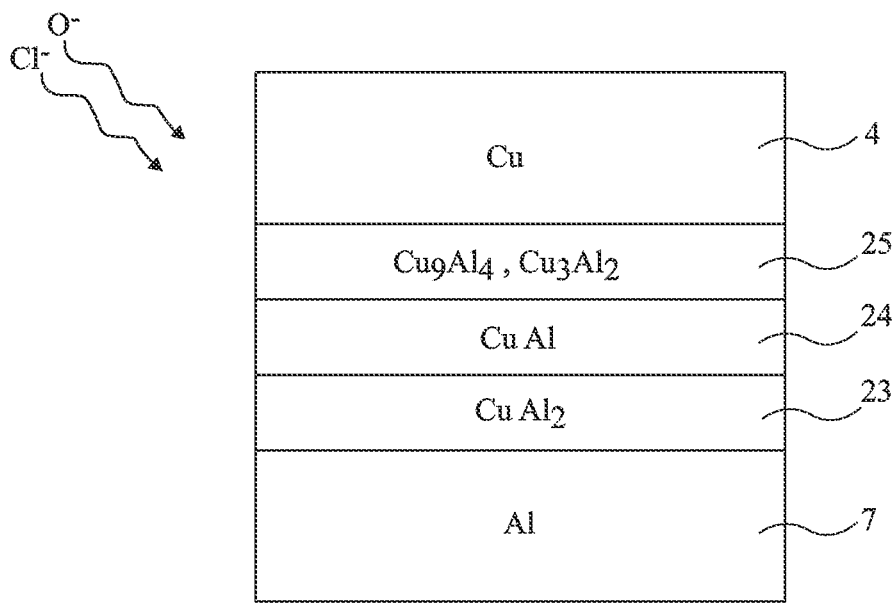
FIGS. 2A and 2B show the chemical components capable of forming at the copper aluminum interface.
Figure 2B:
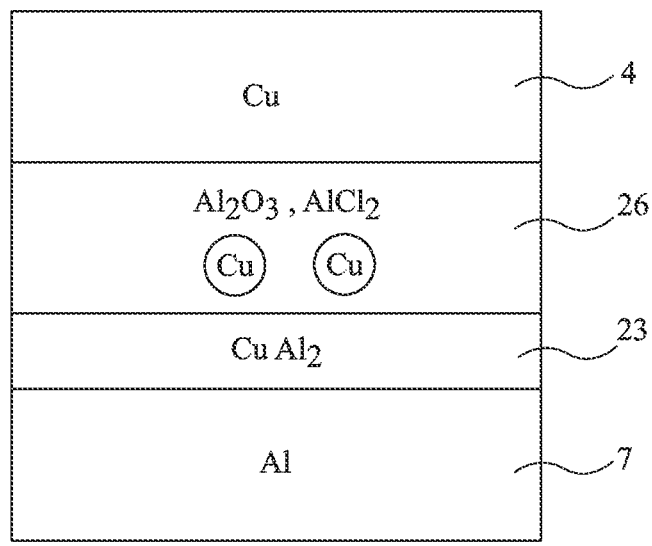

For clarity, the same elements have been designated with the same reference numerals in the different drawings and, further, as usual in the representation of integrated circuits, the various drawings are not to scale.

Figure 3:
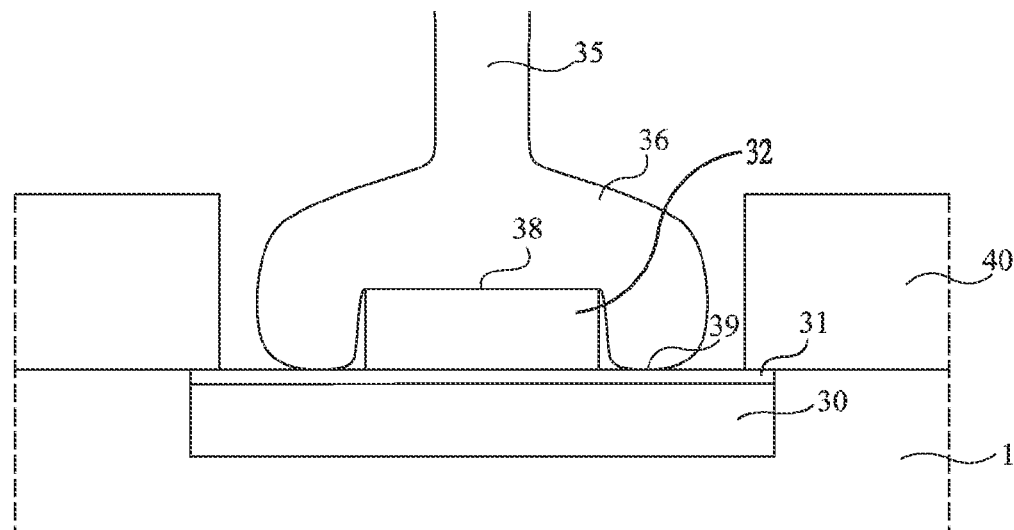
FIG. 3 is a cross-section view of a connection between a copper wire and a pad to which it is welded according to an embodiment.

FIG. 3 shows a connection wire connected to a welding pad. The welding pad comprises on a copper pad 30 a barrier layer 31, for example, made of TiN, and an aluminum pad 32. The aluminum pad has a smaller surface area than the copper pad and the barrier layer topping this pad, whereby aluminum pad 32 is fully contained within the surface corresponding to the surface area of the copper pad. Once a copper wire 35 having a ball 36 formed at its end has been welded by ultrasounds on the pad surface, ball 36 is crushed. The dimension of the aluminum pad is such that after crushing, ball 36 comprises, on the one hand, a portion 38 in contact with the upper surface of aluminum pad 32, and on the other hand, a peripheral pad 39 which contacts barrier layer 31. In practice, after the crushing and friction operation, the barrier layer may have disappeared so that the portion of ball 36 at the periphery of aluminum pad 32 comes in direct contact with copper pad 30.

Thus, the peripheral ring of ball 36 which, after welding, comes into contact with barrier layer 31 and/or copper layer 30, forms a protective ring which, in some embodiments, avoids or at least limits the progress of humidity infiltrations towards the periphery of region 38 of contact between the copper ball and the aluminum pad. Contact region 38 is thus protected from any contamination. Tests carried out by the present inventors have shown that due to this arrangement, the reliability of a connection between a copper wire and a pad is considerably increased. In particular, lifetime tests have shown a reduction or elimination of the separation phenomena over time.

Further, conventionally, FIG. 3 shows a protection layer 40 which defines a window delimiting the useful portion of the welding pad.

As an example of dimensions, the lateral dimensions of copper pad 30 may be on the order of 100×100 μm², the window defined in layer 40 substantially having the same dimensions. Aluminum pad 32 may have dimensions on the order of 50×50 μm². Ball 36 initially formed at the end of copper wire 35 may have a diameter on the order of 50 μm, to have a lateral extension on the order of 75×75 μm² after crushing. Further, copper pad 30 may have a thickness approximately ranging from 2 to 3 μm, barrier layer 31 may have a thickness approximately ranging from 20 to 30 nm, and aluminum pad 32 may have a thickness approximately ranging from 1 to 2.5 μm. Of course, these values are provided as an example only and the dimensions of the pad, and more specifically of aluminum pad 32, will be adapted to the dimensions of wire 35 and of ball 36 formed at the end of this wire, and to the dimensions taken by this ball after crushing and vibrating to weld the wire to the pad.

Figure 4A:
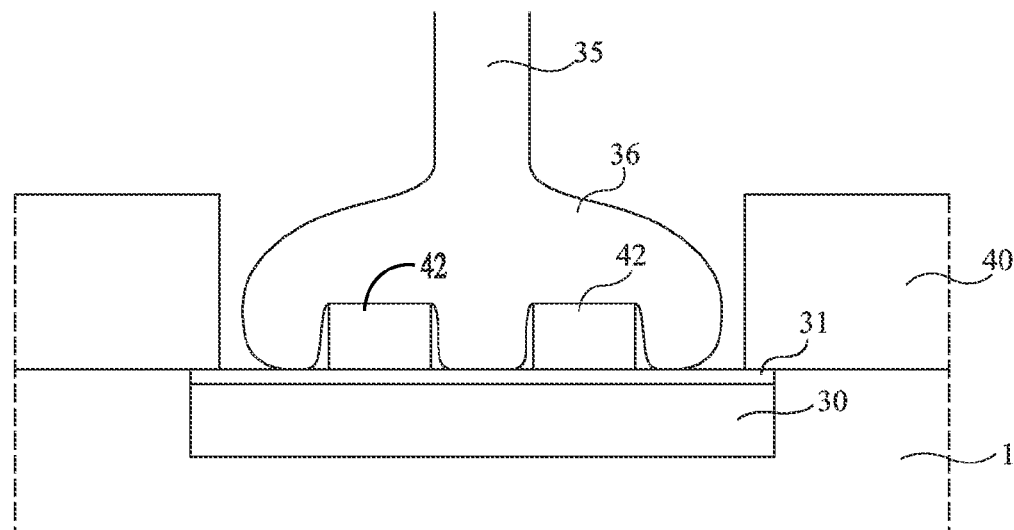
FIGS. 4A and 4B are respective cross-section and top views according to an alternative embodiment.
Figure 4B:
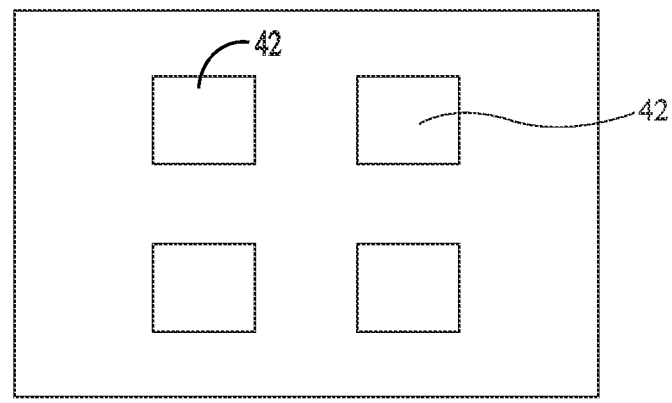

FIGS. 4A and 4B are a cross-section view and a top view of an alternative embodiment in which aluminum pad 32, instead of being continuous, is divided into protrusion or spaced apart pads 42. Four spaced apart pads 42 have been shown herein. In practice, according to the pad dimensions and to the technologies used, any number of protrusions or pads may be used.

It is considered that this variation may be useful in certain cases to further improve the bonding between the copper wire and the pad.

FIGS. 5A to 5D shows an example method of forming a pad of the type illustrated in FIG. 3.

Figure 5A:
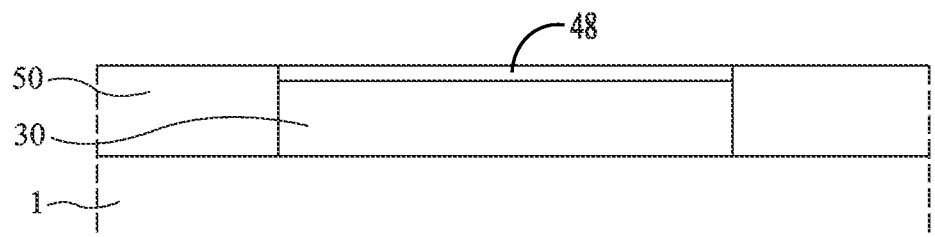
FIGS. 5A to 5D illustrate steps of the method for manufacturing a welding pad according to an embodiment.

As illustrated in FIG. 5A, on the upper portion of a substrate 1, currently on the last metal layer formed from among the metallization levels covering an integrated circuit, a copper pad 30 surrounded with an insulating layer 50 has been formed. In practice, insulating layer 50 may first have been formed, after which a copper layer, previously planarized by chemical-mechanical polishing, may have been deposited, to obtain, as shown, the copper pad fully surrounded with insulating layer 50. A barrier layer 48, such as TiN, is formed on the upper surface of the copper pad. Other types of barrier layers may be used, for example, Ti, Ta, TaN.

Figure 5B:
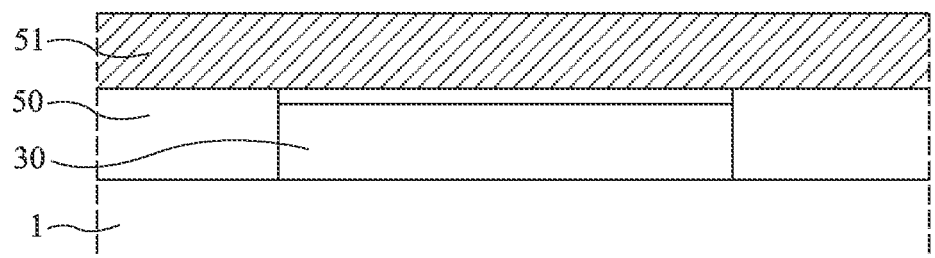

As illustrated in FIG. 5B, an aluminum layer 51 is then deposited on the structure.

Figure 5C:
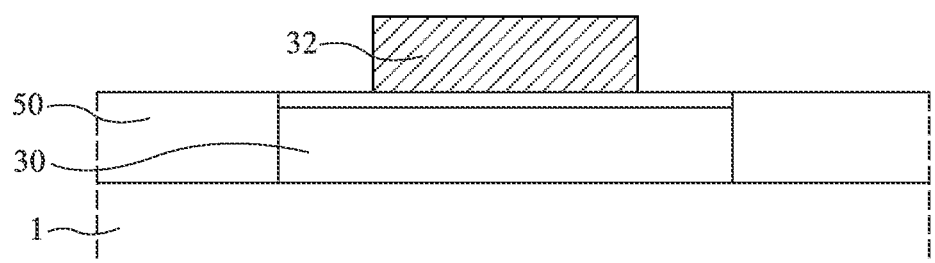

As illustrated in FIG. 5C, this aluminum layer is then etched to define an aluminum pad 32 having dimensions selected as indicated previously.

Figure 5D:
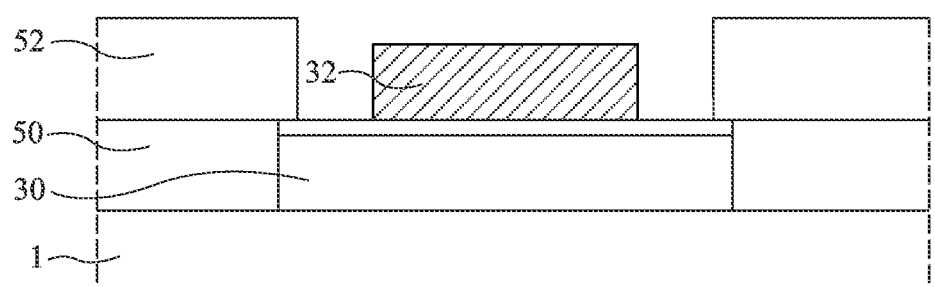

At the step illustrated in FIG. 5D, a passivation layer 52, which is opened to have a slightly smaller opening than the surface of copper pad 30, so that there exists a free area at the periphery of aluminum pad 32, is redeposited.

Specific embodiments of the present disclosure have been described. The specific embodiments described above can be combined to provide further embodiments. Additionally, various alterations, modifications, and improvements will readily occur to those skilled in the art. In particular, the dimensions of the various elements and the thicknesses of the various layers will be selected according to the technologies used. Further, although an aluminum pad has been previously mentioned, this pad, instead of being a pure aluminum pad, may be an alloy of aluminum and copper or of any other selected material. In particular, technologies in which the various depositions may be performed at temperatures lower than 300° C., and even at 150° C., will preferably be selected. It is to be appreciated that the steps of the method described above may be performed sequentially, in parallel, omitted, or in a different order than is described.

Such alterations, modifications, and improvements are intended to be part of this disclosure, and are intended to be within the spirit and the scope of the present disclosure. Accordingly, the foregoing description is by way of example only and is not intended to be limiting. In general, in the following claims, the terms used should not be construed to limit the claims to the specific embodiments disclosed in the specification and the claims, but should be construed to include all possible embodiments along with the full scope of equivalents to which such claims are entitled.

What is claimed is:

1. An apparatus comprising:
   a substrate;
   a first pad that includes copper formed on the substrate;
   a barrier layer over the first pad;
   a second pad of pure aluminum over the barrier layer, the second pad having dimensions that are smaller than dimensions of the first pad, the second pad having a first height;
   a protection layer over the substrate and the barrier layer, the protection layer having an opening over the barrier layer, the second pad being located in the opening of the protection layer, the protection layer and the second pad being spaced apart from each other by a space, the protection layer having a second height that is greater than the first height; and
   a deformed copper ball bonded to the second pad and to at least one of the first pad and the barrier layer such that the deformed copper ball substantially surrounds exposed portions of the second pad, a portion of the deformed copper ball being formed in the space between the protection layer and the second pad.

2. The apparatus of claim 1, wherein the second pad is one of a plurality of second pads formed over the barrier layer, the plurality of second pads collectively having dimensions that are smaller than dimensions of the first pad.

3. The apparatus of claim 2, wherein the deformed copper ball is bonded to the plurality of second pads and to at least one of the first pad and the barrier layer such that the deformed copper ball substantially surrounds exposed portions of the second pad.

4. The apparatus of claim 1, wherein the protection layer is a passivation layer.

5. The apparatus of claim 1, wherein the barrier layer is titanium nitride.

6. The apparatus of claim 1 further comprising a copper wire extending from the deformed copper ball.

7. The apparatus of claim 1 wherein the barrier layer is directly touching the first pad and the second pad is directly touching the barrier layer.

8. The apparatus of claim 1 wherein the protection layer is over a perimeter of the first pad and the barrier layer and has an opening above a center portion of the first pad and a center portion of the barrier layer, the second pad being located in the opening of the protection layer.

9. The apparatus of claim 1 further comprising insulating layer around the first pad and the barrier layer, the insulating layer being below the protection layer.

10. An apparatus comprising:
    a bond pad stack, the bond pad stacking including:
        a first pad that includes copper;
        a barrier layer above the first pad;
        a second pad of pure aluminum over the barrier layer, the second pad having dimensions that are smaller than dimensions of the first pad; and
    a protection layer over a portion of the barrier layer, a cavity formed by sidewalls of the protection layer and sidewalls of the second pad;
    a copper wire including a first end having a deformed copper ball that is bonded to the second pad and to at least one of the first pad and the barrier layer such that the deformed copper ball substantially surrounds exposed portions of the second pad, a portion of the deformed copper ball filling at least a portion of the cavity between the second pad and the protection layer.

11. The apparatus of claim 10, further comprising a dielectric covering the periphery of the first pad.

12. The apparatus of claim 10, wherein the barrier layer is titanium nitride.

13. The apparatus of claim 10, wherein the second pad is one of a plurality of pads, the plurality of pads collectively having dimensions that are smaller than dimensions of the ball-shaped end of the copper wire after the ball-shaped end of the copper wire has been bonded to the bonding pad.

14. The apparatus of claim 10 wherein the barrier layer is directly touching the first pad and the second pad is directly touching the barrier layer.

15. The apparatus of claim 10 wherein the protection layer is a passivation layer.

16. The apparatus of claim 10 wherein the protection layer has a first height, and the second pad has a second height, the second height being less than the first height.

17. The apparatus of claim 16 wherein the second pad is a single second pad.

18. The apparatus of claim 16 wherein the protection layer is over a perimeter of the first pad and the barrier layer and has an opening over a center portion of the bond pad stack, the second pad being located in the opening of the protection layer.

* * * * *